(12) United States Patent
Jun et al.

(10) Patent No.: US 12,310,120 B2
(45) Date of Patent: May 20, 2025

(54) STRUCTURE AND PROCESS OF EASILY EXPANDABLE ASSEMBLED SOLAR MODULES AND ASSEMBLIES

(71) Applicant: KOREA UNIVERSITY RESEARCH AND BUSINESS FOUNDATION, Seoul (KR)

(72) Inventors: Yongseok Jun, Seoul (KR); Yoonmook Kang, Seoul (KR); Chanyong Lee, Seoul (KR); Kyungjin Chae, Ansan-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 18/362,611

(22) Filed: Jul. 31, 2023

(65) Prior Publication Data

US 2023/0387340 A1    Nov. 30, 2023

Related U.S. Application Data

(63) Continuation of application No. PCT/KR2022/003189, filed on Mar. 7, 2022.

(30) Foreign Application Priority Data

May 4, 2021    (KR) .................. 10-2021-0057767

(51) Int. Cl.
*H10F 19/20*    (2025.01)
*H10F 77/20*    (2025.01)

(52) U.S. Cl.
CPC ........... *H10F 19/20* (2025.01); *H10F 77/211* (2025.01)

(58) Field of Classification Search
CPC ............. H02S 30/10; H01L 31/022425; H01L 31/0475; H01L 31/05
See application file for complete search history.

(56) References Cited

U.S. PATENT DOCUMENTS

| | | | | |
|---|---|---|---|---|
| 3,427,200 A | * | 2/1969 | Ernest | H01L 25/03 136/246 |
| 5,538,563 A | * | 7/1996 | Finkl | H01L 31/0547 136/246 |
| 6,091,017 A | | 7/2000 | Stern | |
| 9,741,887 B2 | | 8/2017 | Woo et al. | |
| 2012/0037206 A1 | | 2/2012 | Norman et al. | |

(Continued)

FOREIGN PATENT DOCUMENTS

| | | | |
|---|---|---|---|
| JP | 2018162633 A | * | 10/2018 |
| KR | 10-2012-0085574 A | | 8/2012 |
| KR | 10-2014-0079637 A | | 6/2014 |

(Continued)

OTHER PUBLICATIONS

Machine translation of JP-2018162633-A, Ebe K et al. (Year: 2018).*

(Continued)

*Primary Examiner* — Mayla Gonzalez Ramos
(74) *Attorney, Agent, or Firm* — NSIP Law

(57) ABSTRACT

Disclosed in the present invention is a solar module, comprising: a frame including at least three sidewalls; first solar cells each having both ends coupled to each of two sidewalls of the frame; and second solar cells intersecting the first solar cells and coupled to each of the two sidewalls of the frame.

20 Claims, 17 Drawing Sheets

(56) References Cited

U.S. PATENT DOCUMENTS

2014/0216521 A1    8/2014    Bracken et al.
2015/0162474 A1*   6/2015    Uchida ................ H01L 31/055
                                                                      136/247

FOREIGN PATENT DOCUMENTS

| KR | 10-1527362 B1 | 6/2015 |
|---|---|---|
| KR | 10-2018-0063629 A | 6/2018 |
| KR | 10-1927828 B1 | 12/2018 |
| KR | 10-2020-0013407 A | 2/2020 |

OTHER PUBLICATIONS

International Search Report issued in counterpart Korean Patent Application No. PCT/KR2022/003189 Jun. 17, 2022 (2 Pages in English, 3 pages in Korean).

* cited by examiner

STRUCTURE AND PROCESS OF EASILY EXPANDABLE ASSEMBLED SOLAR MODULES AND ASSEMBLIES

CROSS-REFERENCE TO RELATED APPLICATION

Pursuant to 35 USC 120 and 365(c), this application is a continuation of International Application No. PCT/KR2022/003189 filed on Mar. 7, 2022, and claims the benefit under 35 USC 119(a) of Korean Application No. 10-2021-0057767 filed on May 4, 2021, in the Korean Intellectual Property Office, the entire disclosures of which are incorporated herein by reference for all purposes.

TECHNICAL FIELD

The present invention relates to a photovoltaic module.

Meanwhile, the present invention is derived from research conducted as part of the new renewable energy core technology development (R&D) of the Ministry of Trade, Industry and Energy (Project No: 1415180700, project management institution: Korea Institute of Energy Technology Evaluation and Planning, research project name: Development of Transparent Photovoltaic Module Platform with Convenient Extensions, task performing institution: Korea University Industry-University Cooperation Foundation, research period: 2021.10.01-2022.03.31, contribution rate:

Further, the present invention is derived from research conducted as part of smart farm multi-departmental package innovation technology development (R&D) of the Ministry of Agriculture, Food and Rural Affairs (Project No: 1545025889, project management institution: Korea Institute of Planning and Evaluation for Technology in Food, Agriculture and Forestry, and Korea Smart Farm R&D Foundation, research project name: Development and Optimization of Module Structure of Light Transmission Solar Cell, task performing institution: Korea University Industry-University Cooperation Foundation, research period: 2022.01.01-2022.12.31, contribution rate: 7/10).

Meanwhile, there is no property interest of the Korean government in any aspect of the present invention.

BACKGROUND ART

An element that converts energy of photons generated from the sun into electrical energy through the photovoltaic effect is referred to as a solar cell, and an assembly in which two or more solar cells are connected in series or parallel to a single circuit is referred to as a photovoltaic module.

A core material of the solar cell is a light absorbing layer that exhibits the photovoltaic effect, and examples of the materials thereof include silicon, copper indium gallium selenide (CIGS), cadmium telluride (CdTe), a III-V group element composite, a photoactive organic material, a perovskite, a quantum dot, and the like.

In general, solar systems, which are systems that convert light energy into electrical energy using solar cells, are used as independent power sources generally for homes or industries or used as auxiliary power sources in connection with commercial alternating current (AC) power systems.

The solar cell is manufactured by p-n joining a semiconductor material and uses the photovoltaic effect in which a small amount of current flows when the solar cell receives a light beam. Most common solar cells include large-area p-n junction diodes, and when an electromotive force generated between both ends of the p-n junction diode is provided to an external circuit, the p-n junction diode serves as a unit solar cell. Since the above-configured solar cell has a small electromotive force, a photovoltaic module having an appropriate electromotive force is configured by connecting a plurality of solar cells and is used.

A grid-connected solar system used as a commonly used building exterior type includes a plurality of solar cell arrays that convert solar energy into electrical energy, an inverter that converts, into AC power, direct current (DC) power that is the electrical energy converted by the solar cell arrays and supplies the AC power to a place of use, and the like.

In such a solar system, installation of the solar cell arrays that is installed to obtain solar energy is the most important factor in a configuration of the system, and such solar cell arrays are installed on a separately secured site, a roof of a building, or the like.

Thus, a separate space should be secured to install the solar system in the building. In general, a cooling tower constituting a cooling apparatus is installed in the roof of the building. Thus, a place in which the solar cell arrays are installed is narrow and limited, and the installation of the solar cell arrays is limited, and installation work becomes difficult.

To compensate for these disadvantages, there is a case in which the solar system is applied to a window and door system installed for lighting and ventilation of the building.

However, the solar system according to the related art has a complicated installation structure, and thus installation and expansion thereof are difficult.

DETAILED DESCRIPTION OF THE INVENTION

Technical Problem

An object of the present invention is to provide a photovoltaic module in which solar cells are easily coupled and thus modularized and respective photovoltaic modules are connected to increase the size of the module.

Meanwhile, the aspects to be achieved in the present invention are not limited to the aspects described above, and those skilled in the art to which the present invention pertains will clearly understand other aspects not described from the following description.

Technical Solution

A photovoltaic module according to an embodiment of the present invention may include a frame including at least three side walls, a first solar cell having both ends connected to the two side walls of the frame, and a second solar cell intersecting the first solar cell and coupled to the two side walls of the frame.

Each of the at least three side walls may include a body, a plurality of protrusion portions spaced apart from each other in a lengthwise direction and protruding upward from the body, and an insertion groove formed in an upper portion of the body by the adjacent protrusion portions, and each of the first solar cell and the second solar cell may be inserted into the insertion groove.

Further, each of the first solar cell and the second solar cell may include a positive electrode and a negative electrode, and the frame further includes a conductor disposed on a side surface of the protrusion portion to be electrically connected to the positive electrode or the negative electrode.

Further, the conductor may be disposed to cover both side surfaces and an upper surface of each of the plurality of protrusion portions in the lengthwise direction, and the conductor may be disconnected in the insertion groove.

Further, the conductor may include a plurality of first conductors arranged on one side surface in one direction among both side surfaces of the protrusion portion, and a second conductor that is disposed in the body and connects the first conductors.

Further, the first solar cell may include a first insertion groove recessed from an upper side to a lower side, the second solar cell may include a second insertion groove recessed from the lower side to the upper side, an insertion groove of the side wall and the first insertion groove of the first solar cell parallel to the side wall may correspond to each other, and the first solar cell may be fitted in the second insertion groove, the second solar cell may be inserted into the first insertion groove, and thus the first solar cell and the second solar cell may be coupled to each other.

Further, the first solar cell may include a first insertion groove recessed from an upper side to a lower side and inclined with respect to an upper surface, the second solar cell may include a second insertion groove recessed from the lower side to the upper side, an insertion groove of the side wall and the first insertion groove of the first solar cell parallel to the side wall may correspond to each other, and the first solar cell may be fitted in the second insertion groove, the second solar cell may be inserted into the first insertion groove while being inclined from an upper surface of the first solar cell, and thus the first solar cell and the second solar cell may be coupled to each other.

Further, the photovoltaic module may further include a filling material filled inside the frame.

Further, the filling material may include dispersed light scattering particles or fluorescent dyes.

Further, each of the first solar cell and the second solar cell may include both side surfaces connecting both ends, and a total reflection layer or a diffuse reflection layer may be disposed on at least one side surface among both side surfaces of each of the first solar cell and the second solar cell.

Further, the conductor may include an upper end of the conductor, which covers an upper surface of each of the plurality of protrusion portions, and a side conductor extending from both ends of the upper end of the conductor in the lengthwise direction and disposed on a side surface of each of the plurality of protrusion portions, and the side conductor may be spaced apart from the side surface of the protrusion portion as a distance from the upper end of the conductor increases.

Further, the photovoltaic module may further include an elastic body disposed between the side conductor and the side surface of the protrusion portion.

Further, the first conductor may be spaced apart from the side surface of the protrusion portion as a distance from the upper end of the conductor increases.

Further, the photovoltaic module may further include an elastic body disposed between the first conductor and the side surface of the protrusion portion.

Further, the conductor may be disposed to cover at least some of an upper surface of the body in the insertion groove, the other surface of each of the plurality of protrusion portions in the lengthwise direction, and one side surface of each of the plurality of protrusion portions, and the conductor may be disconnected on the one side surface of the protrusion portion.

Further, the first conductor may be selectively disposed in only one area among a lower area and an upper area among the one side surface of the protrusion portion.

Further, a first photovoltaic module and a second photovoltaic module may be physically and electrically connected to each other, each of the first photovoltaic module and the second photovoltaic module may include a frame including at least three side walls, a first solar cell having both ends connected to the two side walls of the frame, and a second solar cell intersecting the first solar cell and coupled to the two side walls of the frame, a plurality of first solar cells and a plurality of second solar cells may be connected in series to or in parallel to the frame, one side wall among the side walls may have a first polarity, and the other side wall may have a second polarity, and the side wall having the first polarity in the first photovoltaic module may be coupled to the side wall having the second polarity in the second photovoltaic module.

Advantageous Effects of the Invention

According to an embodiment of the present invention, solar cells may be easily coupled and thus modularized, and respective photovoltaic modules may be connected to increase the size of the module.

Meanwhile, the effects obtained in the present invention are not limited to the effects described above, and other effects not described will be clearly understood by those skilled in the art to which the present invention pertains from the following description.

BEST MODE

Figure 1:
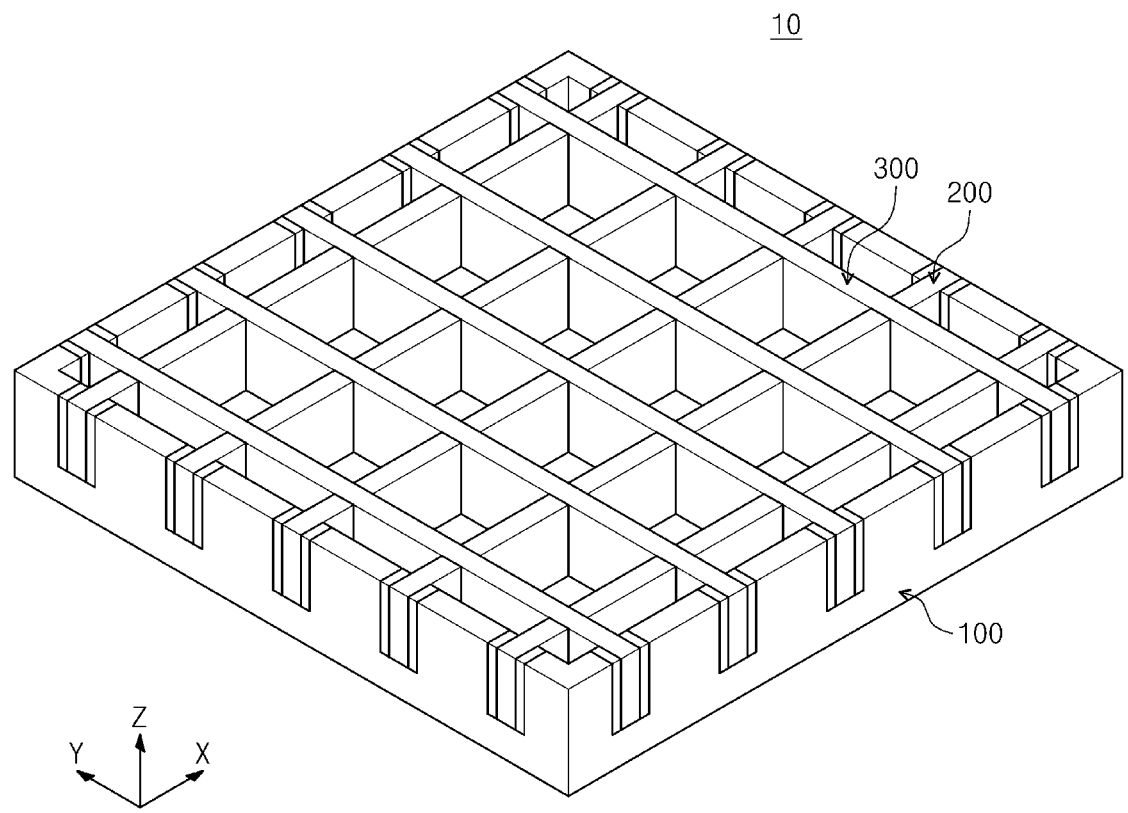
FIG. 1 is a perspective view illustrating a photovoltaic module according to a first embodiment of the present invention.

Hereinafter, embodiments of the present invention will be described in more detail with reference to the accompanying drawings. The embodiments of the present invention may be modified into various forms, and the scope of the present invention should not be construed to be limited to the following embodiments. The present embodiments are provided to describe the present invention for those skilled in the art more completely. Thus, the shapes of the components of the drawings are exaggerated to emphasize a clearer description thereof.

It should be noted in advance that a configuration of the invention for clarifying the solution of the problem to be solved by the present invention will be described in detail with reference to the accompanying drawings on the basis of an exemplary embodiment of the present invention, the same reference numerals are assigned to the same components even though the components are in different drawings in assigning reference numerals to components of the drawings, and components in other drawings may be cited when necessary in the description of the drawings.

Figure 2:
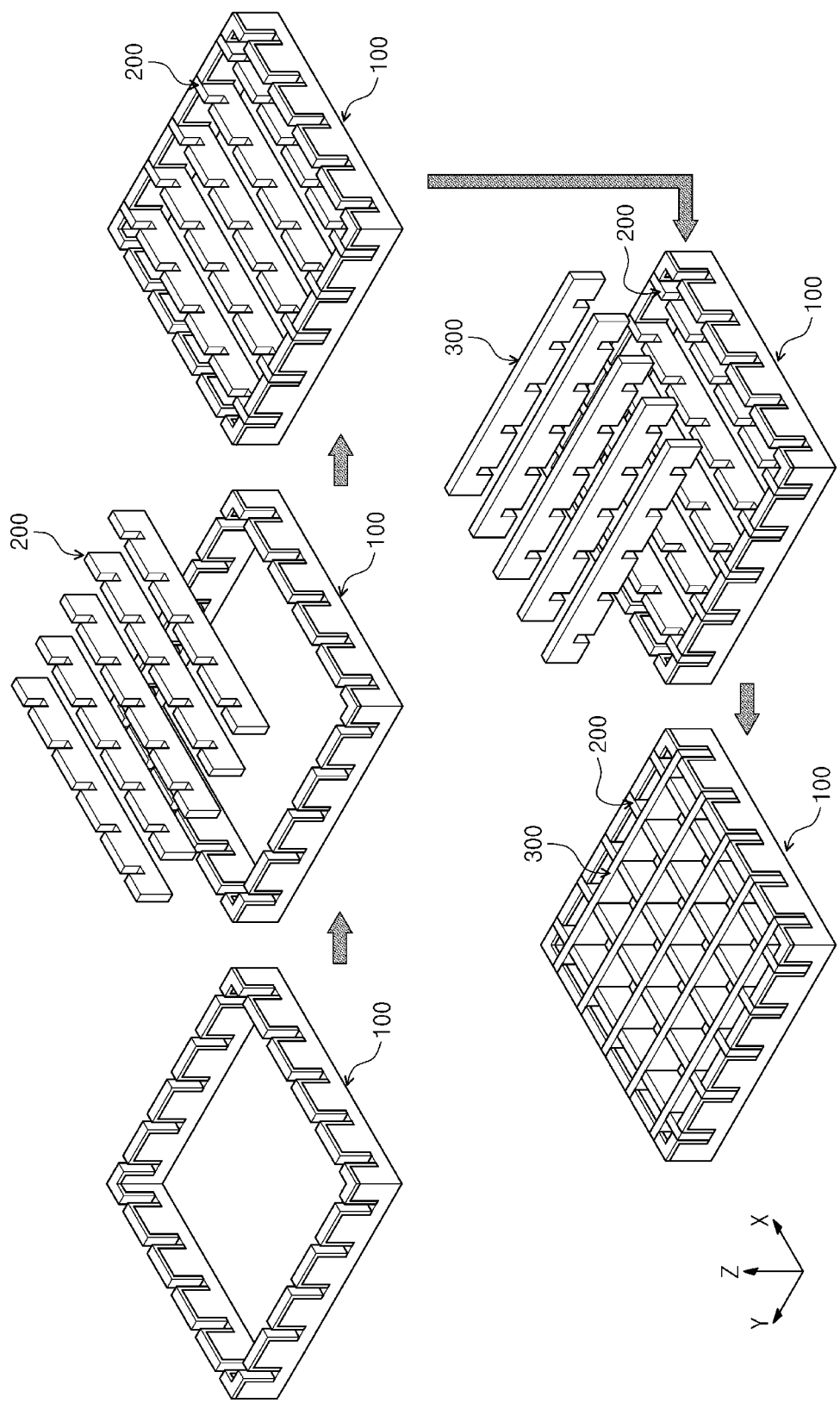
FIG. 2 is an exemplary view sequentially illustrating an installation operation for the photovoltaic module according to the first embodiment of the present invention.
Figure 3:
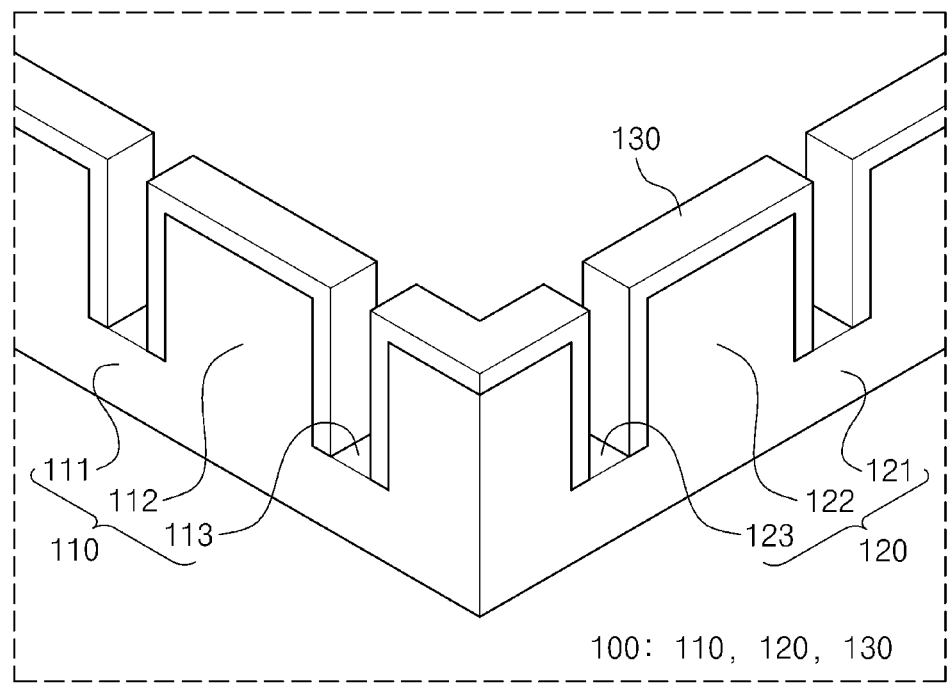
FIG. 3 is a partial perspective view for describing a frame in the photovoltaic module according to the first embodiment of the present invention.
Figure 4:
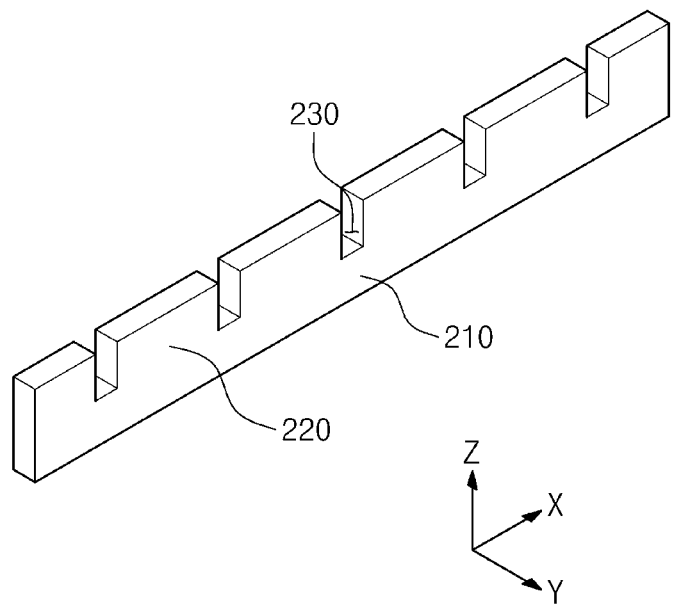
FIG. 4 is a perspective view for describing a first solar cell in the photovoltaic module according to the first embodiment of the present invention.
Figure 5:
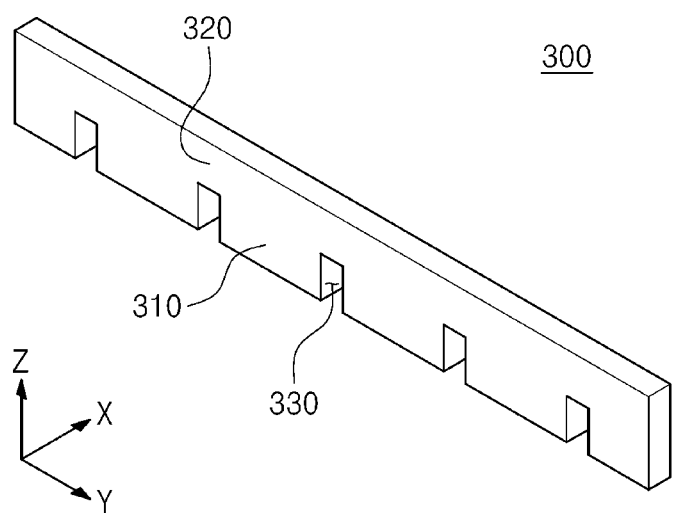
FIG. 5 is a perspective view for describing a second solar cell in the photovoltaic module according to the first embodiment of the present invention.
Figure 6A:
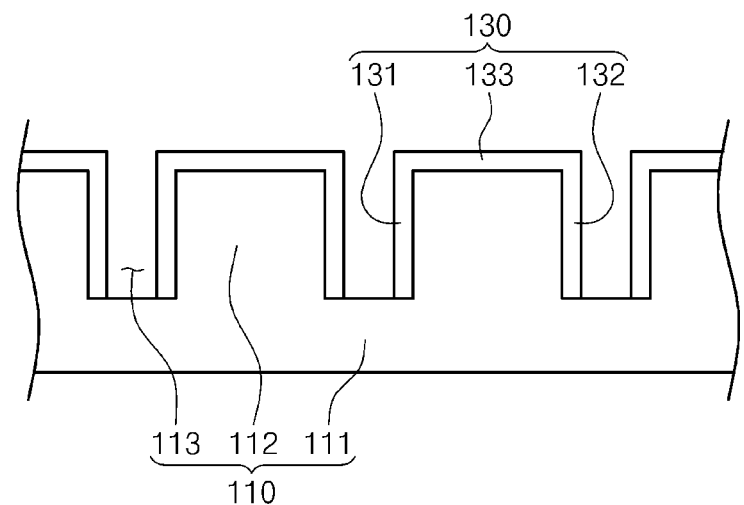
FIGS. 6A and 6B are partial perspective views for describing a series connection structure and a coupling relationship of the frame in the photovoltaic module according to the first embodiment of the present invention.
Figure 6B:
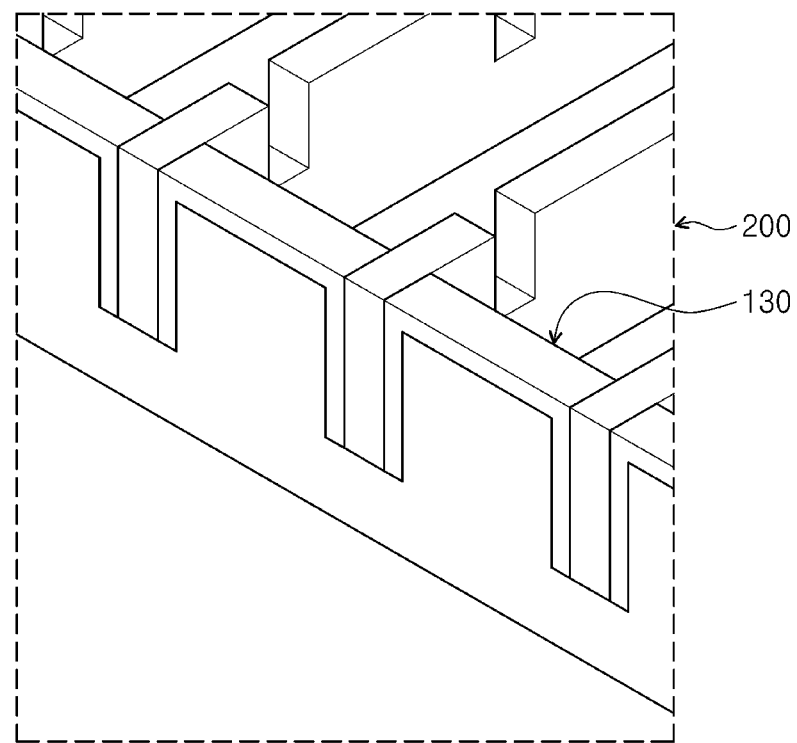

FIG. 1 is a perspective view illustrating a photovoltaic module according to a first embodiment of the present invention, FIG. 2 is an exemplary view sequentially illustrating an installation operation for the photovoltaic module according to the first embodiment of the present invention, FIG. 3 is a partial perspective view for describing a frame in the photovoltaic module according to the first embodiment of the present invention, FIG. 4 is a perspective view for describing a first solar cell in the photovoltaic module according to the first embodiment of the present invention, FIG. 5 is a perspective view for describing a second solar cell in the photovoltaic module according to the first embodiment of the present invention, FIGS. 6A and 6B are partial perspective views for describing a series connection structure and a coupling relationship of the frame in the photovoltaic module according to the first embodiment of the present invention, and FIG. 7 is a partial perspective view for describing a parallel connection structure and a coupling relationship of the frame in the photovoltaic module according to the first embodiment of the present invention.

Referring to FIGS. 1 to 7, a photovoltaic module 10 according to a first embodiment of the present invention may include a frame 100, a first solar cell 200, and a second solar cell 300.

First, referring to FIG. 2, in the photovoltaic module 10 according to the first embodiment of the present invention, a plurality of first solar cells 200 having a length in a first direction (X-axis direction) may be fixedly inserted into insertion grooves of the frame 100, and a plurality of second solar cells 300 having a length in a second direction (Y-axis direction) may be formed by being inserted into the insertion grooves of the frame 100 and insertion grooves of the first solar cells 200.

Therefore, in the frame 100, the first solar cells 200 and the second solar cells 300 intersect each other so that positions thereof may be fixed.

Here, conductors may be arranged in the insertion grooves of the frame 100 to connect the plurality of inserted first solar cells 200 and the plurality of inserted second solar cells 300 in series or parallel.

That is, the photovoltaic module 10 according to the first embodiment of the present invention may physically and electrically connect the plurality of solar cells 200 and 300 through a simple coupling structure.

In detail, the frame 100 may include at least three side walls 110 and 120.

Meanwhile, the frame 100 may be a triangular frame, a quadrangular frame, a hexagonal frame, or the like, but the present invention is not limited thereto, and for convenience of description, the frame 100 that is a quadrangular frame having four side walls will be described below as an example.

Further, when the plurality of photovoltaic modules 10 are coupled to each other, the photovoltaic module 10 may be a combination of frames having different angles, in which the frames having a single shape may be coupled to each other.

Referring to FIG. 3, the frame 100 may include the first side wall 110 and the second side wall 120 adjacent to each other and a conductor 130 disposed on an upper exposed surface of the first side wall 110 and the second side wall 120.

The first side wall 110 may include a body 111, a protrusion portion 112, and an insertion groove 113.

The body 111 may have a plate shape having a length in the Y-axis direction.

The protrusion portions 112 may be spaced apart from each other in the Y-axis direction and protrude upward from the body 111.

The insertion groove 113 may be defined as an area between the spaced protrusion portions 112, through which an upper surface of the body 111 is exposed.

The second side wall 120 may include a body 121, a protrusion portion 122, and an insertion groove 123.

The body 121 may have a plate shape having a length in the X-axis direction. Here, an end of the body 111 of the first side wall 110 and an end of the body 121 of the second side wall 120 may be coupled to each other to form a corner of the frame.

The protrusion portions 122 may be spaced apart from each other in the X-axis direction and protrude upward from the body 121.

The insertion groove 123 may be defined as an area between the spaced protrusion portions 122, through which an upper surface of the body 121 is exposed.

The conductors 130 may be arranged on portions of surfaces of the first side wall 110 and the second side wall 120, which are exposed in an upward direction (Z-axis direction). Therefore, the first solar cells 200 and the second solar cells 300 inserted into the insertion grooves 113 and 123 may be electrically connected.

Meanwhile, the conductor 130 disposed on the first side wall 110 and the conductor 130 disposed on the second side wall 120 have the same polarity and thus may be integrally connected to each other. However, the conductor disposed on a side wall (not illustrated) facing the first side wall 110 and connected to the second side wall 120 and the conductor 130 disposed on the second side wall 120 have different polarities, and thus may not be connected to each other. Here, the conductors 130 arranged on the side walls may function as a + terminal or a − terminal. That is, the conductors 130 arranged on the side walls of the frame 100 may have the same polarity or different polarities according to a connection structure.

The plurality of first solar cells 200 and the plurality of second solar cells 300 may be connected in series or parallel according to the arrangement structure of the conductors 130.

Meanwhile, the arrangement structure of the conductors 130 will be described below with reference to FIGS. 6A, 6B, and 7.

The first solar cell 200 and the second solar cell 300 are different from each other only in terms of structures and may have the same configuration.

Meanwhile, in the photovoltaic module according to the present invention, two or more soar cells may be coupled and arranged according to a structure of the frame. For example, when the frame has a pentagonal shape or hexagonal shape, three solar cells may be coupled, and when the frame has a heptagonal shape or octagonal shape, four solar cells may be coupled.

Here, the solar cells 200 and 300 may be formed in a shape having a length, a thickness, and a width.

For example, thin-film solar cells 200 and 300 having a thickness of 10 nm to 10 µm or silicon solar cells 200 and 300 having a thickness of 50 µm to 300 µm may be applied to the solar cells 200 and 300.

In detail, types of the solar cells 200 and 300 applied to the present invention are not limited, but in the present invention, the silicon solar cell or the like may be applied.

That is, the silicon solar cell may be variously classified according to the type and structure of a used substrate and may be roughly classified into a multicrystalline silicon solar cell and a monocrystalline silicon solar cell according to crystal characteristics of a light absorption layer.

The monocrystalline solar cell, being a typical silicon solar cell, is a solar cell that uses the monocrystalline silicon wafer as a substrate. Further, the silicon solar cell is manufactured in a multi-junction structure, for example, a tandem junction structure in which one layer of solar cell that absorbs a light beam having another wavelength is further laminated on the silicon solar cell, a triple junction structure in which one layer of solar cell that absorbs a light beam having still another wavelength is further laminated on the tandem junction structure, or the like. Alternatively, the silicon solar cell is manufactured in a hybrid structure. Thus, conversion efficiency is raised to a level higher than that of the silicon solar cell according to the related art.

In the present invention, the solar cells 200 and 300 are installed in parallel to a height direction (Z-axis direction) of the frame 100 so as not to be hindered by interference of an input angle of the sunlight and are installed in a range that does not interfere with a visual field of a user.

Meanwhile, the solar cells 200 and 300 may include the plurality of solar cells 200 and 300 arranged to be spaced apart from each other in the X-axis direction and the Y-axis direction.

Here, the plurality of solar cells 200 and 300 may be arranged to be spaced apart from each other at regular intervals within the frame 100.

Meanwhile, the solar cells 200 and 300 may be of a bifacial light-receiving type as described above, but in the embodiment of the present invention, light receiving surfaces may be formed on side surfaces of the solar cells 200 and 300 and non-light receiving surfaces may be formed on the other side surfaces thereof.

That is, the solar cells 200 and 300 are alternately installed inside the frame 100 and may collect input sunlight through the light receiving surfaces and convert the collected input sunlight into a photocurrent.

Referring to FIG. 4, the first solar cell 200 may have a length in a state in which the X-axis direction is defined as a lengthwise direction, have both ends in the lengthwise direction, and include one side surface 210 facing one side in a thickness direction and the other side surface 220 facing a side opposite thereto in a state in which the Y-axis direction perpendicular to the lengthwise direction is defined as the thickness direction. Further, in the first solar cell 200, the Z-axis direction may be defined as a width direction.

Herein, in the first embodiment of the present invention, the one side surface 210 and the other side surface 220 are light receiving surfaces, a first electrode (not illustrated) having a first polarity may be disposed on the one side surface 210, and a second electrode (not illustrated) having a second polarity opposite to the first polarity may be disposed on the other side surface 220.

Further, the first solar cells 200 may include first insertion grooves 230 spaced apart from each other in the lengthwise direction and recessed from the upper side to the lower.

The second solar cell 300 may be inserted into the first insertion groove 230 in the form of crossing the first solar cell 200.

Meanwhile, the first insertion groove 230 may have a position and a size corresponding to the insertion groove of the opposite side wall. Therefore, the second solar cell 300 may be inserted into the insertion groove 230 of the first solar cell 200 and the insertion groove of the side wall and arranged together. Referring to FIG. 5, the second solar cell 300 may have a length in a state in which the Y-axis direction is defined as a lengthwise direction, have both ends in the lengthwise direction, and include one side surface 310 facing one side in a thickness direction and the other side surface 320 facing a side opposite thereto in a state in which the X-axis direction perpendicular to the lengthwise direction is defined as the thickness direction. Further, in the second solar cell 300, the Z-axis direction may be defined as a width direction.

Herein, in the first embodiment of the present invention, the one side surface 310 and the other side surface 320 are light receiving surfaces, a first electrode (not illustrated) having a first polarity may be disposed on the one side surface 310, and a second electrode (not illustrated) having a second polarity opposite to the first polarity may be disposed on the other side surface 320.

Further, the second solar cells 300 may include first insertion grooves 330 spaced apart from each other in the lengthwise direction and recessed from the lower side to the upper side.

The first solar cell 200 may be inserted into the second insertion groove 330, the first insertion groove 230 and the second insertion groove 330 may be coupled to each other, and the lower surface and the upper surface of the first solar cell 200 and the second solar cell 300 may form the same plane.

Meanwhile, the second insertion groove 330 may have a position and a size corresponding to the insertion groove of the opposite side wall. Therefore, the first solar cell 200 may be inserted into the insertion groove 330 of the second solar cell 300 and the insertion groove of the side wall and arranged together.

Meanwhile, although not illustrated, each of the first solar cell 200 and the second solar cell 300 does not include an insertion groove for insertion, and the first solar cell 200 and the second solar cell 300 may be alternately laminated in the form in which the upper surface of the first solar cell 200 is in contact with the lower surface of the second solar cell 300.

Meanwhile, in the first solar cell 200 or the second solar cell 300, the first electrode and the second electrode may be arranged together on one side surface among the one side surfaces 210 and 310 and the other side surfaces 220 and 230. A seventh embodiment therefor will be described below with reference to FIGS. 17A and 17B.

Referring to FIGS. 6A and 6B, the conductor 130 that connects the first solar cell 200 and the second solar cell 300 in series may be disposed on each of the side walls 110 and 120 of the frame 100.

The conductor 130 may include side surfaces 131 and 132 arranged on both side surfaces of the protrusion portions 112 and 122 of the side walls 110 and 120 and an upper surface 133 that connects the side surfaces 131 and 132 and is disposed on the upper surfaces of the protrusion portions 112 and 122. Here, the conductor 130 may be disconnected in areas of the insertion grooves 113 and 123, through which the bodies 111 and 121 are exposed. That is, the conductor 130 may not be disposed in the areas of the insertion grooves 113 and 123, through which the bodies 111 and 121 are exposed.

When the first solar cell 200 or the second solar cell 300 is fixedly inserted into the insertion grooves 113 and 123, the electrode formed on the one side surfaces 210 and 310 of the first solar cell 200 or the second solar cell 300 may be electrically connected to the one side surface 131, and the electrode formed on the other side surfaces 220 and 320 of the first solar cell 200 or the second solar cell 300 may be electrically connected to the other one side surface 132. Therefore, the plurality of first solar cells 200 and the plurality of second solar cells 300 may be connected in series to each other.

Figure 7A:
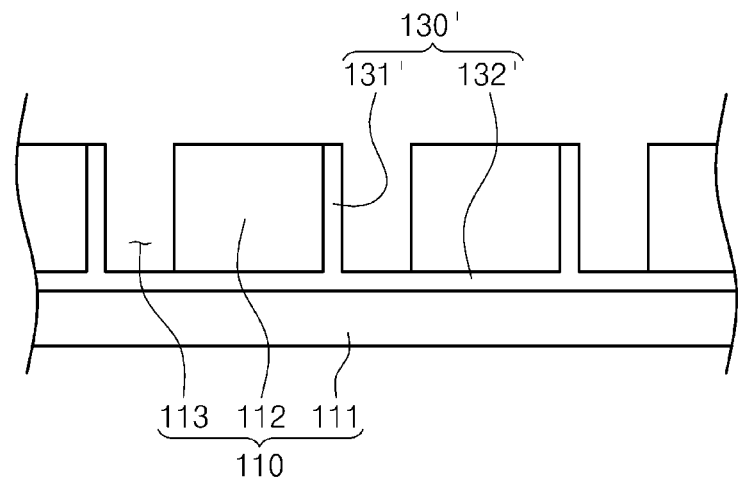
FIGS. 7A and 7B are partial perspective views for describing a parallel connection structure and a coupling relationship of the frame in the photovoltaic module according to the first embodiment of the present invention.
Figure 7B:
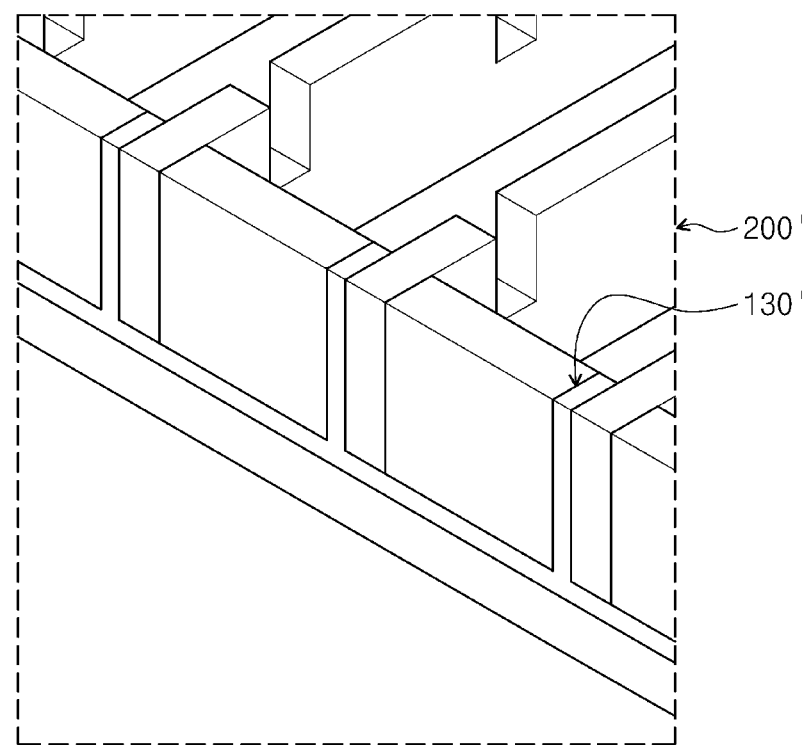

Referring to FIGS. 7A and 7B, the conductor 130 that connects the first solar cell 200 and the second solar cell 300 in parallel may be disposed on each of the side walls 110 and 120 of the frame 100.

The conductor 130' may include first conductors 131' arranged on side surfaces of the protrusion portions 112 and 122 of the side walls 110 and 120 and a second conductor 132' connecting the plurality of first conductors 131' and arranged on the bodies 111 and 121.

In one side wall, when one end of the first solar cell 200 or the second solar cell 300 is fixedly inserted into the insertion groove 113 or 123, the first electrode formed on the one side surface 210 or 310 of the first solar cell 200 or the second solar cell 300 may be electrically connected to the first conductor 131'. Further, in another side wall, when the other end of the first solar cell 200 or the second solar cell 300 is fixedly inserted into the insertion groove 113 or 123, the second electrode formed on the other side surface 220 or 320 of the first solar cell 200 or the second solar cell 300 may be electrically connected to the first conductor (not illustrated).

Therefore, the plurality of first solar cells 200 and the plurality of second solar cells 300 may be connected in parallel to each other.

Hereinafter, a photovoltaic module 20 according to a second embodiment of the present invention will be described with reference to FIGS. 8 to 11.

Figure 8:
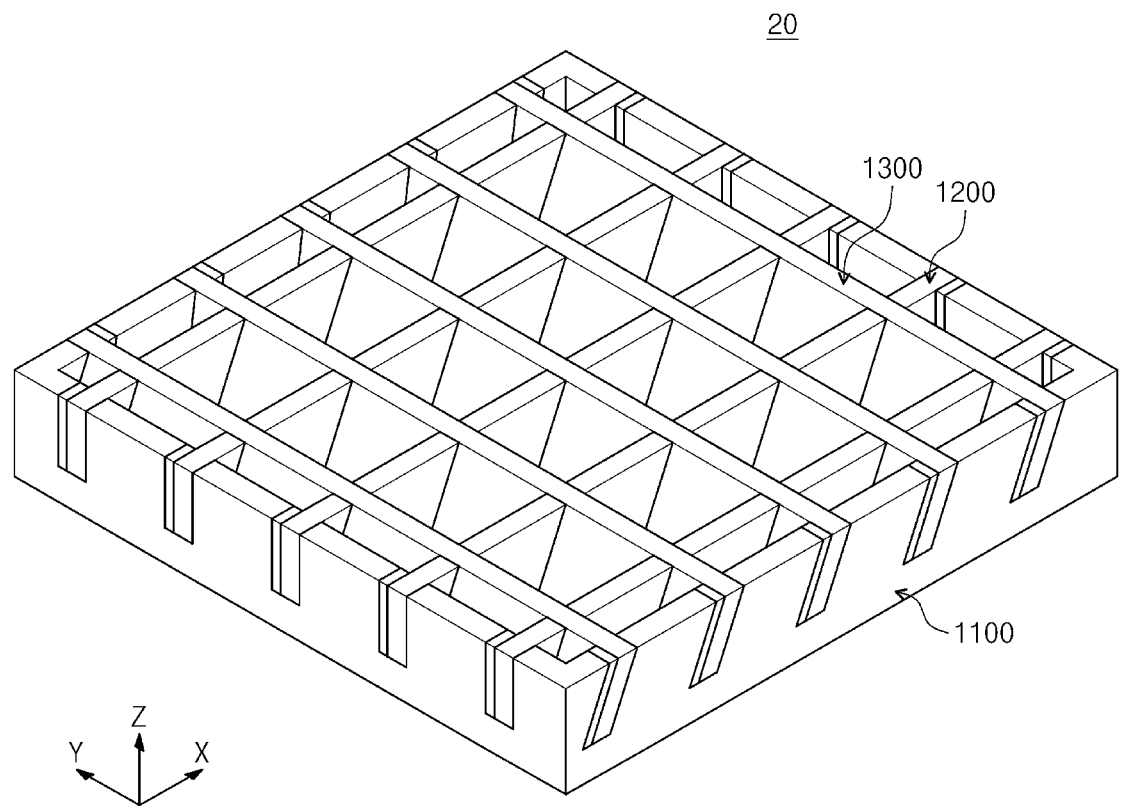
FIG. 8 is a perspective view illustrating a photovoltaic module according to a second embodiment of the present invention.
Figure 9:
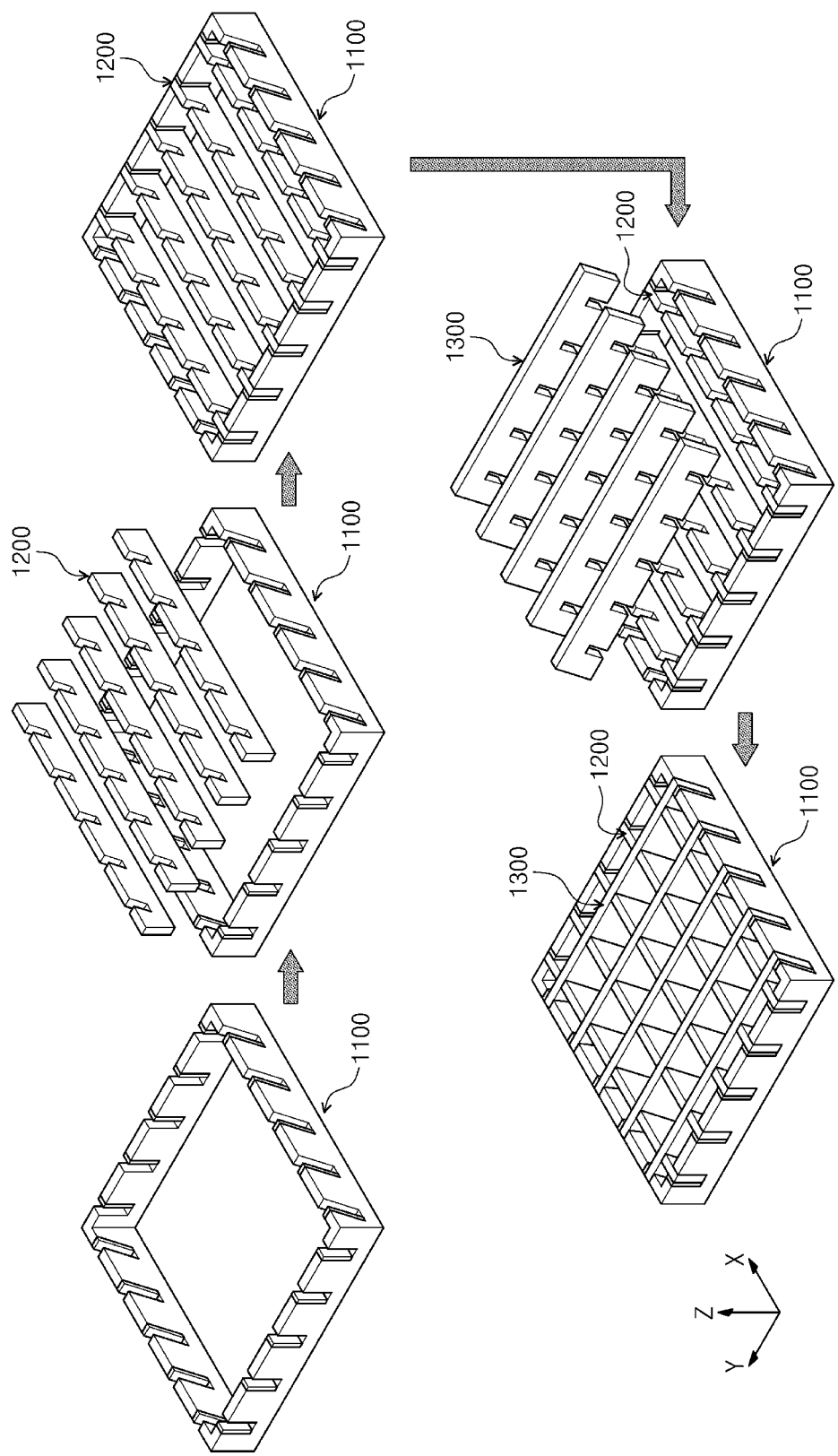
FIG. 9 is an exemplary view sequentially illustrating an installation operation for the photovoltaic module according to the second embodiment of the present invention.
Figure 10:
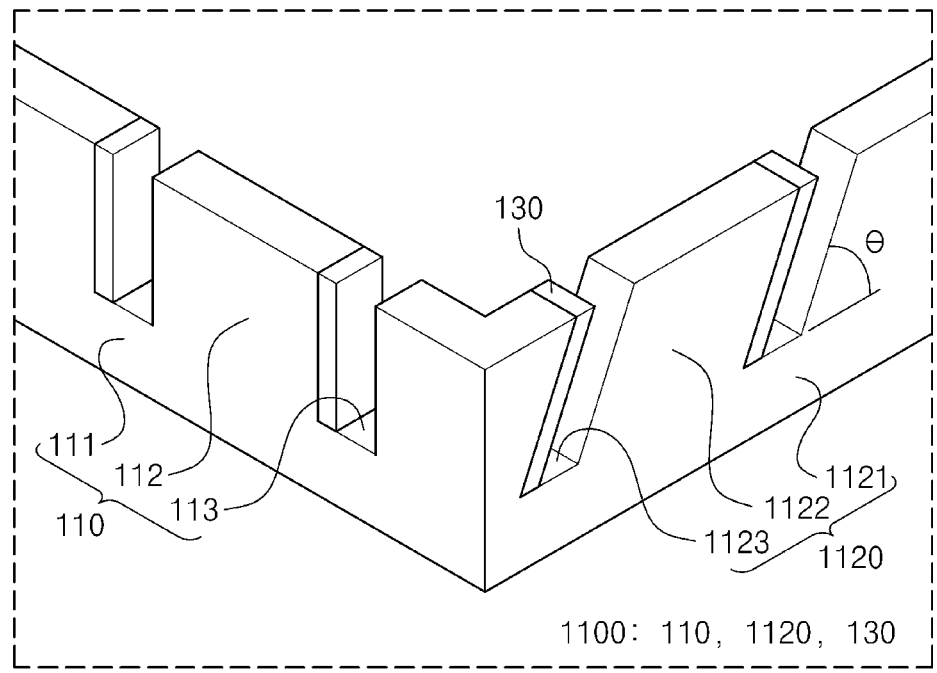
FIG. 10 is a partial perspective view for describing a frame in the photovoltaic module according to the second embodiment of the present invention.
Figure 10:
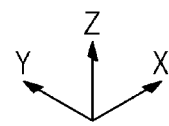
Figure 11:
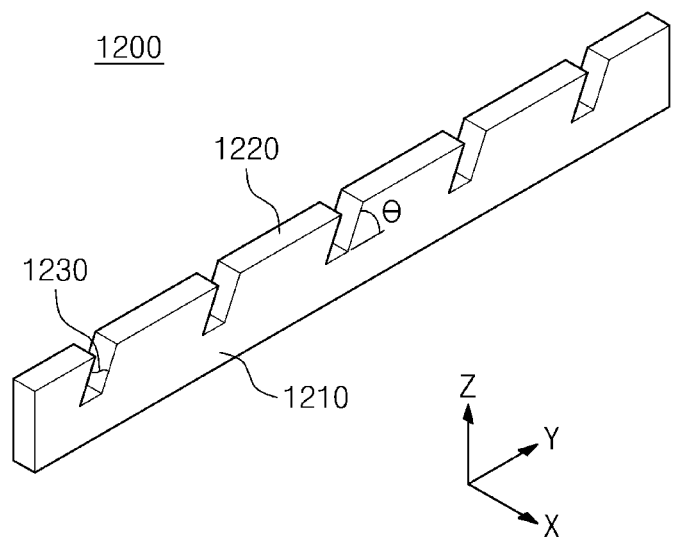
FIG. 11 is a perspective view for describing a first solar cell in the photovoltaic module according to the second embodiment of the present invention.

FIG. 8 is a perspective view illustrating a photovoltaic module according to a second embodiment of the present invention, FIG. 9 is an exemplary view sequentially illustrating an installation operation for the photovoltaic module according to the second embodiment of the present invention, FIG. 10 is a partial perspective view for describing a frame in the photovoltaic module according to the second embodiment of the present invention, and FIG. 11 is a perspective view for describing a first solar cell in the photovoltaic module according to the second embodiment of the present invention.

The photovoltaic module 20 according to the second embodiment of the present invention may include a frame 1100, a first solar cell 1200, and a second solar cell 1300. Hereinafter, only a configuration of the photovoltaic module 20 according to the second embodiment, which is different from the photovoltaic module 10 according to the first embodiment, will be described in detail.

First, referring to FIG. 8, in the photovoltaic module 20 according to the second embodiment of the present invention, a plurality of first solar cells 1200 having a length in the first direction (X-axis direction) may be fixedly inserted into insertion grooves of the frame 1100, and a plurality of second solar cells 1300 having a length in the second direction (Y-axis direction) may be formed by being inserted into the insertion grooves of the frame 1100 and insertion grooves of the first solar cells 1200.

Here, in the photovoltaic module 20 according to the second embodiment of the present invention, the first solar cell 1200 or the second solar cell 1300 is disposed to have a predetermined angle θ with respect to an upper surface of the frame 1100.

Therefore, the amount of a light beam input to a light receiving surface of the first solar cell 1200 or the second solar cell 1300 may increase, thereby improving the photovoltaic efficiency of the photovoltaic module 20.

Meanwhile, in the photovoltaic module 20 according to the second embodiment, both the first solar cell 1200 and the second solar cell 1300 may be arranged to have the predetermined angle θ with respect to the upper surface of the frame 1100. However, hereinafter, for convenience of description, a case in which the second solar cell 1300 is disposed to have the predetermined angle θ with respect to the upper surface of the frame 1100 will be described.

Conductors may be arranged in the insertion grooves of the frame 1100 to connect the plurality of inserted first solar cells 1200 and the plurality of inserted second solar cells 1300 in series or parallel.

That is, the photovoltaic module 20 according to the second embodiment of the present invention may physically and electrically connect the plurality of solar cells 1200 and 1300 through a simple coupling structure.

Referring to FIG. 10, the frame 1100 may include the first side wall 110 and a second side wall 1120 adjacent to each other and the conductor 130 disposed on the first side wall 110 and the second side wall 1120.

The first side wall 110 may include the body 111, the protrusion portion 112, and the insertion groove 113.

The body 111 may have a plate shape having a length in the Y-axis direction.

The protrusion portions 112 may be spaced apart from each other in the Y-axis direction and protrude upward from the body 111.

The insertion groove 113 may be defined as an area between the spaced protrusion portions 112, through which the upper surface of the body 111 is exposed.

The second side wall 1200 may include a body 1121, a protrusion portion 1122, and an insertion groove 1123.

The body 1121 may have a plate shape having a length in the X-axis direction. Here, an end of the body 111 of the first side wall 110 and an end of the body 1121 of the second side wall 1120 may be coupled to each other to form a corner of the frame.

The protrusion portions 1122 may be spaced apart from each other in the X-axis direction and protrude upward from the body 1121.

The insertion groove 1123 may be defined as an area between the spaced protrusion portions 1122, through which the upper surface of the body 1121 is exposed.

Here, the insertion groove 1123 may be formed to have the predetermined angle θ with respect to the upper surface of the frame 1100. Therefore, the second solar cell 1300 inserted into the insertion groove 1123 may be disposed to have the predetermined angle θ with respect to the upper surface of the frame 1100.

The conductors 130 may be arranged on portions of surfaces of the first side wall 110 and the second side wall 1120, which are exposed in an upward direction (Z-axis direction). Therefore, the first solar cells 1200 and the second solar cells 1300 inserted into the insertion grooves 113 and 123 may be electrically connected (in series or parallel).

The first solar cell 1200 and the second solar cell 1300 are different from each other only in terms of structures and may have the same configuration. Hereinafter, only structures of the first solar cell 1200 and the second solar cell 1300 will be described in detail.

Referring to FIG. 11, the first solar cell 1200 may have a length in a state in which the Y-axis direction is defined as a lengthwise direction, have both ends in the lengthwise direction, and include one side surface 1210 facing one side in a thickness direction and the other side surface 1220 facing a side opposite thereto in a state in which the X-axis direction perpendicular to the lengthwise direction is defined as the thickness direction. Further, in the first solar cell 1200, the Z-axis direction may be defined as a width direction.

Herein, in the second embodiment of the present invention, the one side surface 1210 and the other side surface 1220 are light receiving surfaces, the first electrode (not illustrated) having a first polarity may be disposed on the one side surface 1210, and the second electrode (not illustrated) having a second polarity opposite to the first polarity may be disposed on the other side surface 1220.

Further, the first solar cells 1200 may include first insertion grooves 1230 spaced apart from each other in the lengthwise direction and recessed from the upper side to the lower.

The first insertion groove 1230 may have a position and a size corresponding to the insertion groove 1123 of the opposite side wall and may be formed to have the predetermined angle θ with respect to the upper surface like the insertion groove 1123.

Therefore, the second solar cell 1300 may be inserted into the first insertion groove 1230 of the first solar cell 1200 and the insertion groove 1123 of the side wall and arranged together.

That is, by changing only the shapes of the insertion grooves 1123 and 1230 into which the second solar cell 1300 is inserted, an installation angle of the second solar cell 1300 may be controlled.

Thus, the installation angle of the second solar cell 1300 may be controlled according to an installation environment, and thus the photovoltaic efficiency may be more effectively controlled.

Hereinafter, a photovoltaic module 30 according to a third embodiment of the present invention will be described with reference to FIG. 12.

Figure 12:
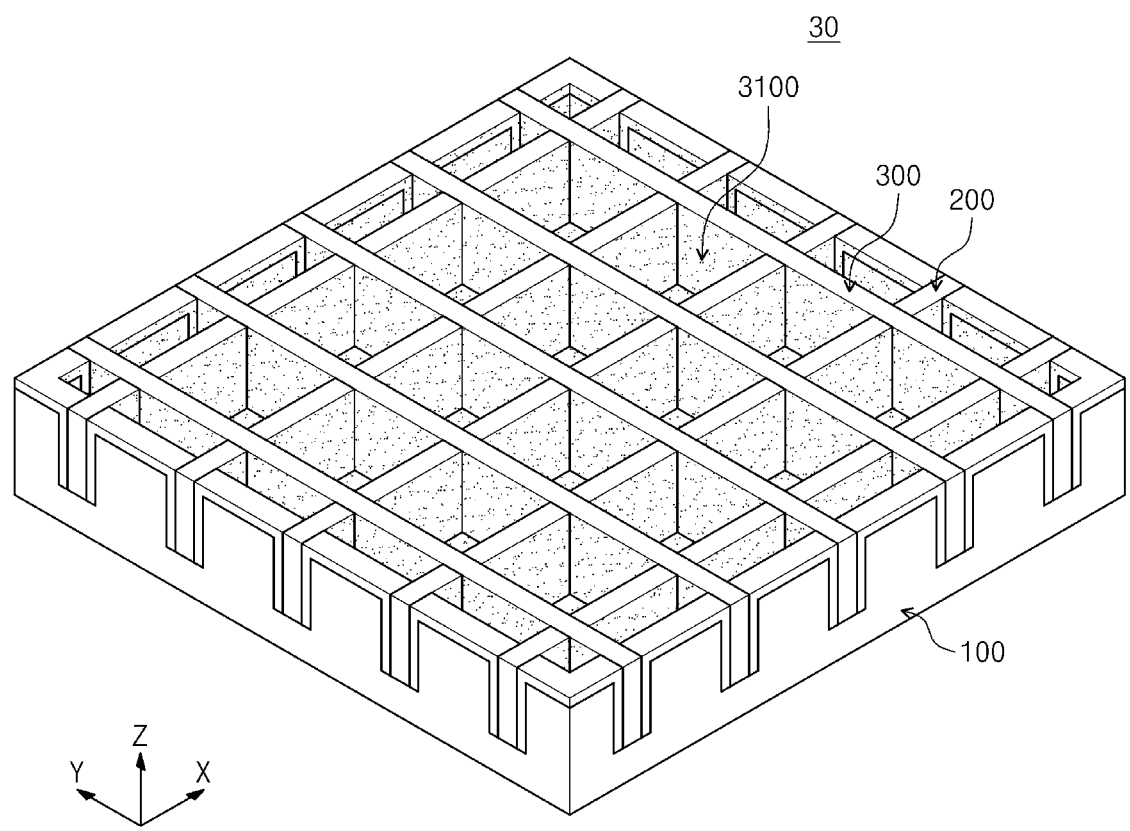
FIG. 12 is a perspective view illustrating a photovoltaic module according to a third embodiment of the present invention.

FIG. 12 is a perspective view illustrating a photovoltaic module according to a third embodiment of the present invention.

The photovoltaic module 30 according to the third embodiment of the present invention may include the frame 100, the first solar cell 200, the second solar cell 300, and a filling material 3100.

Hereinafter, only a configuration of the photovoltaic module 30 according to the third embodiment, which is different from the photovoltaic module 10 according to the first embodiment, will be described in detail.

The filling material 3100 may be inserted into and positioned in the frame 100. That is, the filling material 3100 may be positioned in a lattice space formed by alternately crossing the first solar cell 200 and the second solar cell 300.

Further, when the height of the solar cells 200 and 300 in the Z-axis direction is smaller than the height of the frame 100 in the Z-axis direction, the filling material 3100 may be positioned in an empty space between an upper portion and a lower portion of the solar cells 200 and 300 as well as the lattice space formed by the solar cells 200 and 300 crossing each other. Therefore, the filling material 3100 may completely seal the solar cells 200 and 300.

The filling material 3100 may basically support the first solar cell 200 and the second solar cell 300, serve to alleviate an external impact, and additionally provide other functions.

The filling material 3100 may be made of a transparent polymer such as polydimethylsiloxane (PDMS), polycarbonate (PC), ethylenevinylacetate (EVA), and polyimide (PI).

Meanwhile, the filling material 3100 includes light scattering particles that scatter a light beam therein, fluorescent dyes that absorb a light beam having a specific wavelength and emit a light beam having a different wavelength, and particles that selectively transmit a light beam having a wavelength, and thus the photovoltaic efficiency may increase according to light scattering or wavelength conversion.

Hereinafter, a photovoltaic module 40 according to a fourth embodiment of the present invention will be described with reference to FIGS. 13A and 13B.

Figure 13A:
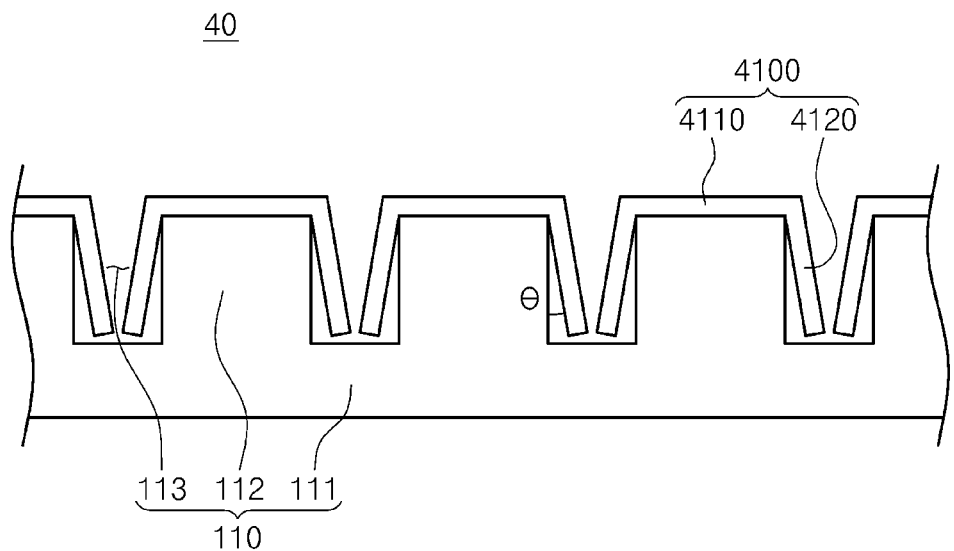
FIGS. 13A and 13B are perspective views illustrating a frame having a series connection structure in a photovoltaic module according to a fourth embodiment of the present invention.
Figure 13B:
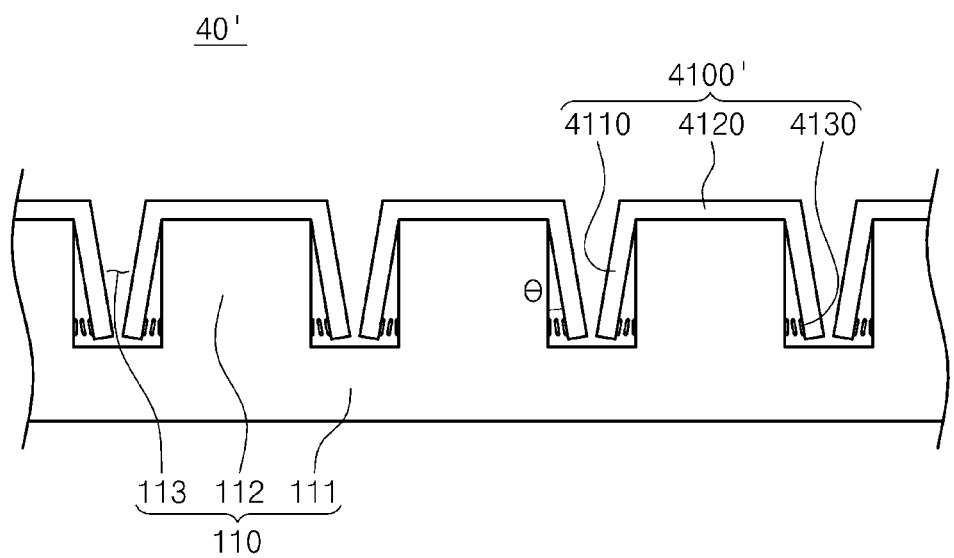

FIGS. 13A and 13B are perspective views illustrating a frame having a series connection structure in a photovoltaic module according to a fourth embodiment of the present invention.

Hereinafter, only a configuration of the photovoltaic module 40 according to the fourth embodiment, which is different from the photovoltaic module 10 according to the first embodiment, will be described in detail.

First, referring to FIG. 13A, the photovoltaic module 40 according to the fourth embodiment of the present invention may include a conductor 4100 disposed on the side wall 110 to connect the plurality of solar cells in series.

The conductor 4100 may include an upper portion 4110 disposed on an upper surface of the protrusion portion 112 of the side wall 110 and a pair of side surface portions 4120 extending from both sides of the upper portion 4110 to a side portion of the protrusion portion 112. Here, the conductor 4100 may be disconnected in an area of the insertion groove 113, through which the body 111 is exposed. That is, the conductor 4100 may not be disposed in the area of the insertion groove 113, through which the body 111 are exposed.

Meanwhile, both the side surface portions 4120 may have an inclination at the predetermined angle θ with respect to a side surface of the protrusion portion 112. That is, an end of each of both side surface portions 4120 may be spaced apart from the side surface of the protrusion portion 112. In detail, both the side surface portions 4120 may be gradually spaced apart from the side surface of the protrusion portion 112 toward the lower side.

When the solar cell is fixedly inserted into the insertion groove 113, the electrode formed on one side surface of the solar cell may be electrically connected to one side surface portion 4120, and the electrode formed on the other side of the solar cell may be electrically connected to the other one side portion 4120. Therefore, the plurality of solar cells may be connected in series to each other.

Further, the side surface portions 4120 facing each other in the insertion groove 113 may press the inserted solar cell to prevent the solar cell from being separated, and reduce a contact resistance, thereby reducing power loss of the photovoltaic module.

Meanwhile, referring to FIG. 13B, a photovoltaic module 40' according to the fourth embodiment of the present invention may include a conductor 4100' disposed on the side wall 110 to connect the plurality of solar cells in series.

The conductor 4100' may further include an elastic body 4130 as compared to the conductor 4100 of FIG. 13A.

The elastic bodies 4130 are disposed between both the side surface portions 4120 and the side surfaces of the protrusion portion 112, and when the solar cell is inserted into the insertion groove 113, the solar cell is more effectively pressed, and thus separation of the solar cell may be more effectively prevented.

Hereinafter, a photovoltaic module 50 according to a fifth embodiment of the present invention will be described with reference to FIGS. 14A and 14B.

Figure 14A:
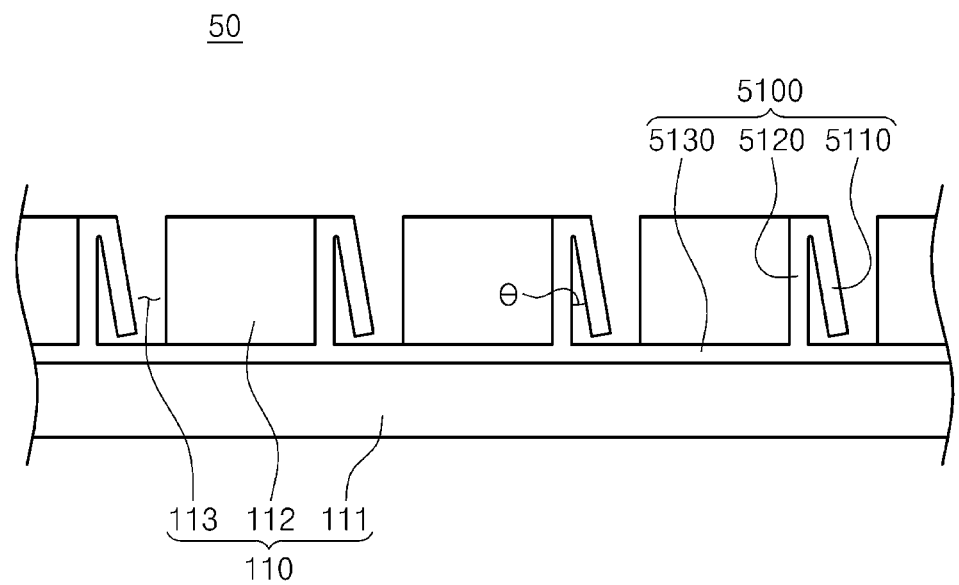
FIGS. 14A and 14B are perspective views illustrating a frame having a parallel connection structure in the photovoltaic module according to a fifth embodiment of the present invention.
Figure 14B:
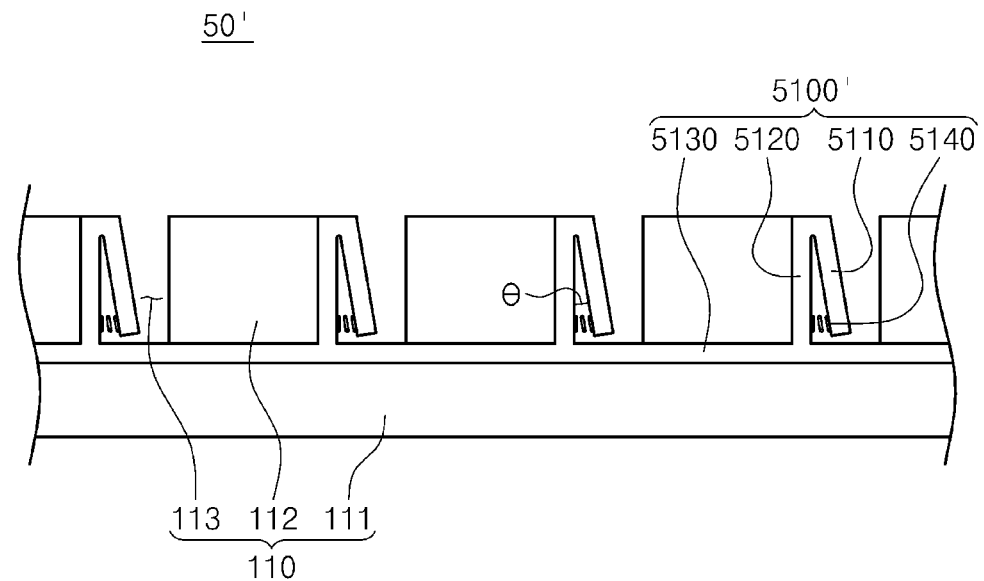

FIGS. 14A and 14B are perspective views illustrating a frame having a parallel connection structure in the photovoltaic module according to a fifth embodiment of the present invention.

Hereinafter, only a configuration of the photovoltaic module 50 according to the fifth embodiment, which is different from the photovoltaic module 10 according to the first embodiment, will be described in detail.

First, referring to FIG. 14A, the photovoltaic module 50 according to the fifth embodiment of the present invention may include a conductor 5100 disposed on the side wall 110 to connect the plurality of solar cells in series.

The conductor 5100 may include a plurality of first conductors 5110 having an inclination at a predetermined angle θ with respect to the side surface of the protrusion portion 112 from the side wall 110, a plurality of connection parts 5120 extending downward from upper ends of the first conductors 5110, and a second conductor 5130 for connecting the plurality of connection parts 5120 and disposed on the body 111.

Meanwhile, the first conductor 5110 may have an inclination at the predetermined angle θ with respect to one side surface of the protrusion portion 112. That is, an end of the first conductor 5110 may be spaced apart from the one side surface of the protrusion portion 112. In detail, the first conductor 5110 may be gradually spaced apart from the one side surface of the protrusion portion 112 toward the lower side.

When one end of the solar cell is fixedly inserted into the insertion groove 113, the first electrode formed on one side surface of the solar cell may be electrically connected to the first conductor 5110, and when the other end of the solar cell is fixedly inserted into the insertion groove in the opposite side wall, the second electrode formed on the other side surface of the solar cell may be electrically connected only to the conductor on an opposite side. Thus, the plurality of solar cells may be connected to the frame in parallel to each other.

Further, the first conductor 5110 formed only on one side surface of the insertion groove 113 may press the inserted solar cell to prevent separation of the solar cell, and maintain a more firm electrical connection state.

Meanwhile, referring to FIG. 14B, a photovoltaic module 50' according to the fifth embodiment of the present invention may include a conductor 5100' disposed on the side wall 110 to connect the plurality of solar cells in series.

The conductor 5100' may further include an elastic body 5140 as compared to the conductor 5100 of FIG. 14A.

The elastic body 5140 is disposed between the first conductor 5110 and the side surface of the protrusion portion 112, and when the solar cell is inserted into the insertion groove 113, the solar cell is more effectively pressed, and thus separation of the solar cell may be more effectively prevented.

Hereinafter, a photovoltaic module 60 according to a sixth embodiment of the present invention will be described with reference to FIGS. 15 and 16.

Figure 15:
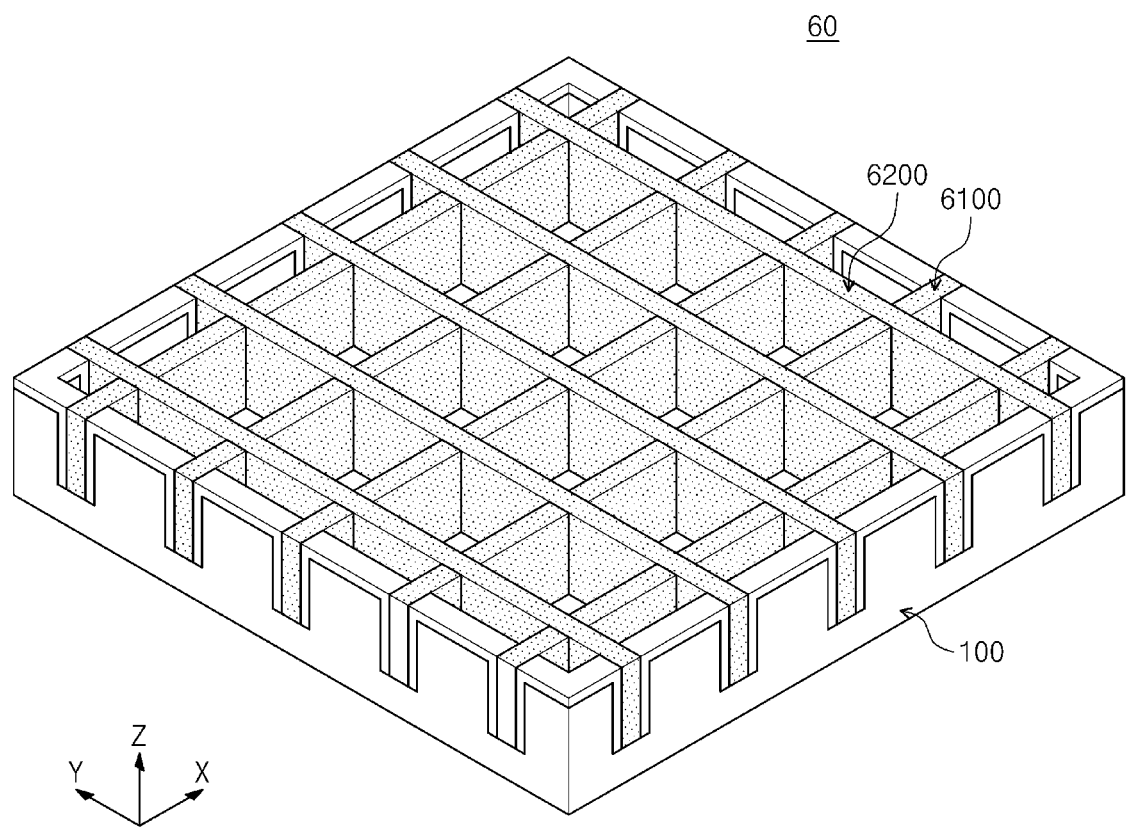
FIGS. 15 and 16 are perspective views illustrating a photovoltaic module according to a sixth embodiment of the present invention.
Figure 16:
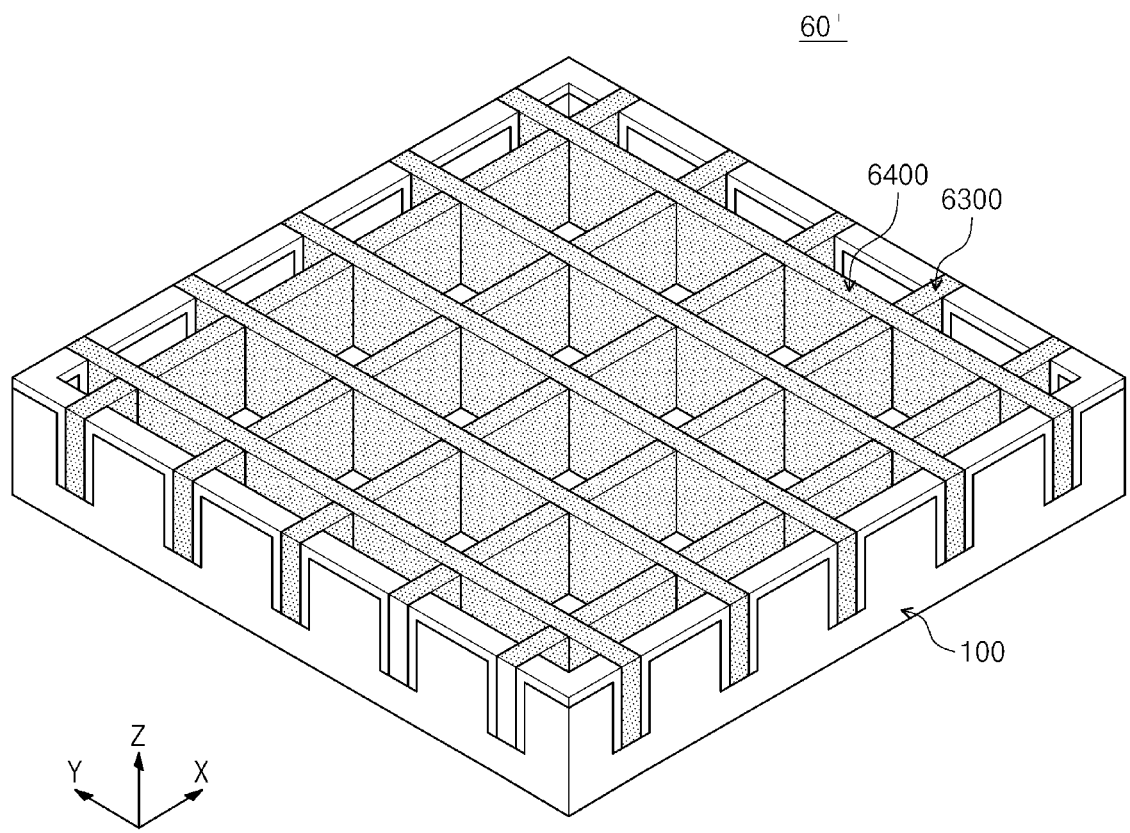

FIGS. 15 and 16 are perspective views illustrating a photovoltaic module according to a sixth embodiment of the present invention.

Hereinafter, only a configuration of the photovoltaic module 60 according to the sixth embodiment, which is different from the photovoltaic module 10 according to the first embodiment, will be described in detail.

First, referring to FIG. 15, in the photovoltaic module 60 according to the sixth embodiment of the present invention, at least one side surface among the light receiving surfaces of each of a plurality of solar cells 6100 and 6200 may be coated with a total reflection material.

For example, when the photovoltaic module 60 according to the sixth embodiment is installed in an upright state, a light beam input from the upper side is reflected by the side surface coated with the total reflection material and is scattered to the lateral side or the upper side, and thus the photovoltaic efficiency may be improved without light loss.

First, referring to FIG. 16, in the photovoltaic module 60' according to the sixth embodiment of the present invention, at least one side surface among the light receiving surfaces of each of a plurality of solar cells 6300 and 6400 may be coated with a diffuse reflection material. Alternatively, a concavo-convex pattern may be formed on at least one side surface among the light receiving surfaces.

Therefore, the input light beam may be dispersed and transmitted to a neighboring solar cell, and thus the photovoltaic efficiency may be improved without light loss.

Hereinafter, a photovoltaic module 70 according to a seventh embodiment of the present invention will be described with reference to FIGS. 17A and 17B.

Figure 17A:
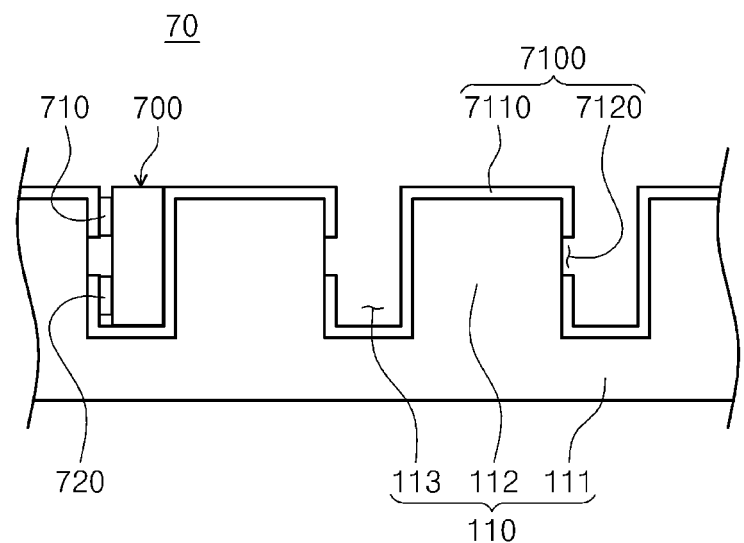
FIGS. 17A and 17B are cross-sectional views illustrating a frame having a connection structure in a photovoltaic module according to a seventh embodiment of the present invention.
Figure 17B:
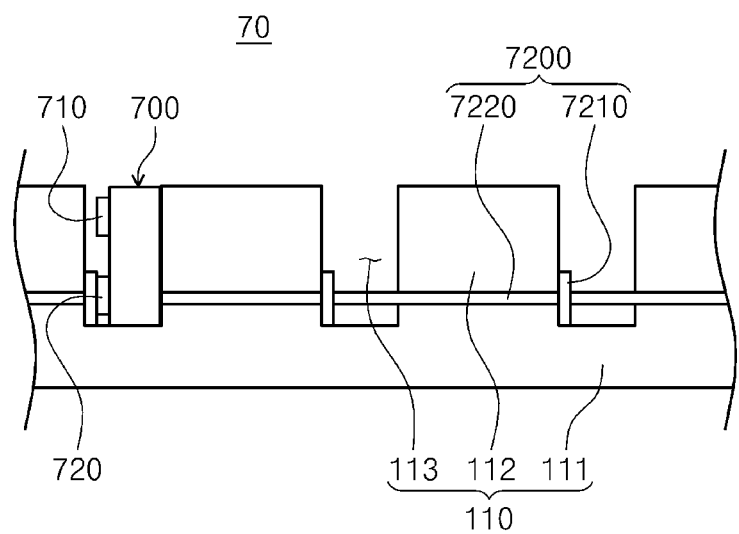

FIGS. 17A and 17B are cross-sectional views illustrating a frame having a connection structure in a photovoltaic module according to a seventh embodiment of the present invention.

Hereinafter, only a configuration of the photovoltaic module 70 according to the seventh embodiment, which is different from the photovoltaic module 10 according to the first embodiment, will be described in detail.

Referring to FIGS. 17A and 17B, in the photovoltaic module 70 according to the seventh embodiment of the present invention, a first electrode 710 and a second electrode 720 may be formed together on one side surface of each of a plurality of solar cells 700.

First, referring to FIG. 17A, a conductor 7100 of the photovoltaic module 70 according to the seventh embodiment of the present invention may include a conductive portion 7110 and a cut portion 7120.

A conductor may be disposed in the conductive portion 7110 to cover a lower portion of the one side surface of the protrusion portion 112, an upper surface of the body 111 in the insertion groove 113, the other side surface of the protrusion portion 112, and an upper surface of the protrusion portion 112.

The cut portion 7120 may be an area in which the conductor is cut between an upper portion and a lower portion of the one side surface of the protrusion portion 112.

Meanwhile, when the plurality of solar cells 700 are inserted into the insertion groove 113, the first electrode 710 and the second electrode 720 arranged on the one side surface of the solar cell 700 may be connected in series while in contact with the conductive portion 7110.

Meanwhile, referring to FIG. 17B, a conductor 7200 of a photovoltaic module according to the seventh embodiment of the present invention may include a conductive portion 7210 and a connection portion 7220.

The conductive portion 7210 may be disposed below or above the one side surface of the protrusion portion 112, and the connection portion 7220 may connect the conductive portion 7210 formed in each protrusion portion 112.

That is, when each of the plurality of solar cells 700 are inserted into the insertion groove 113, the conductive portion 7210 is selectively connected to the first electrode 710 or the second electrode 720 of the solar cell 700, and thus the plurality of solar cells 700 may be connected in parallel.

Hereinafter, a photovoltaic module 80 according to an eighth embodiment of the present invention will be described with reference to FIGS. 18 and 19.

Figure 18:
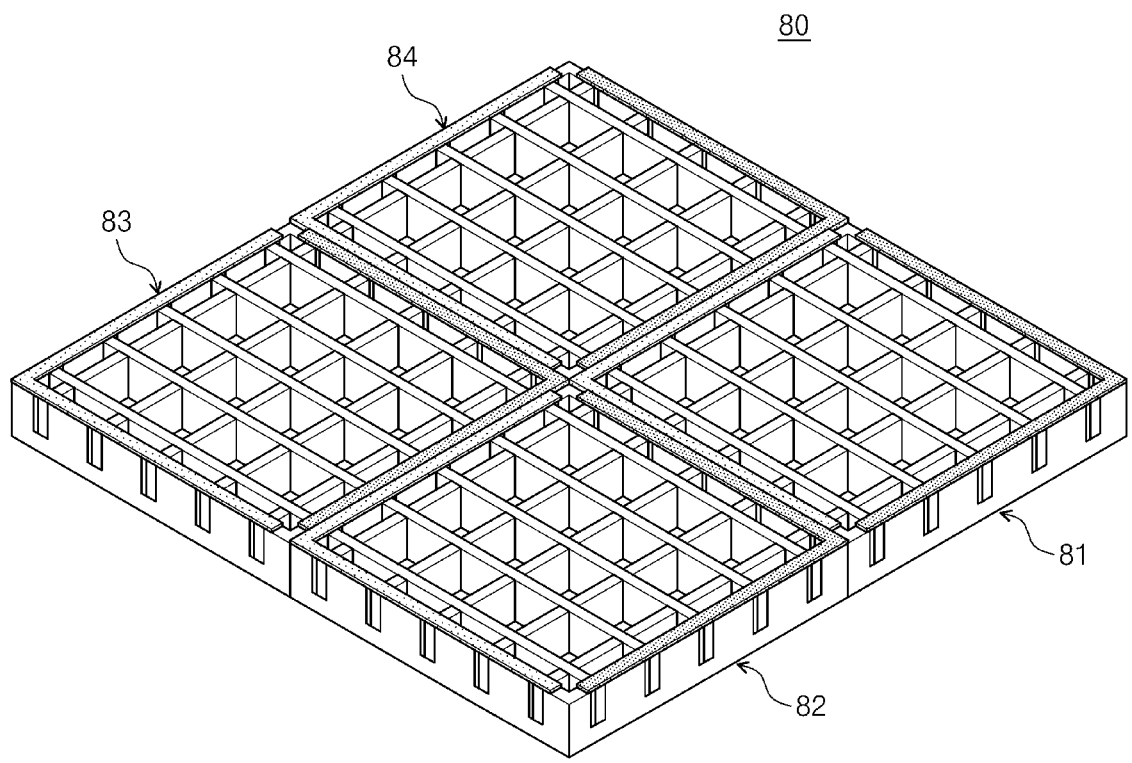
FIG. 18 is a perspective view illustrating a photovoltaic module according to an eighth embodiment of the present invention.
Figure 19:
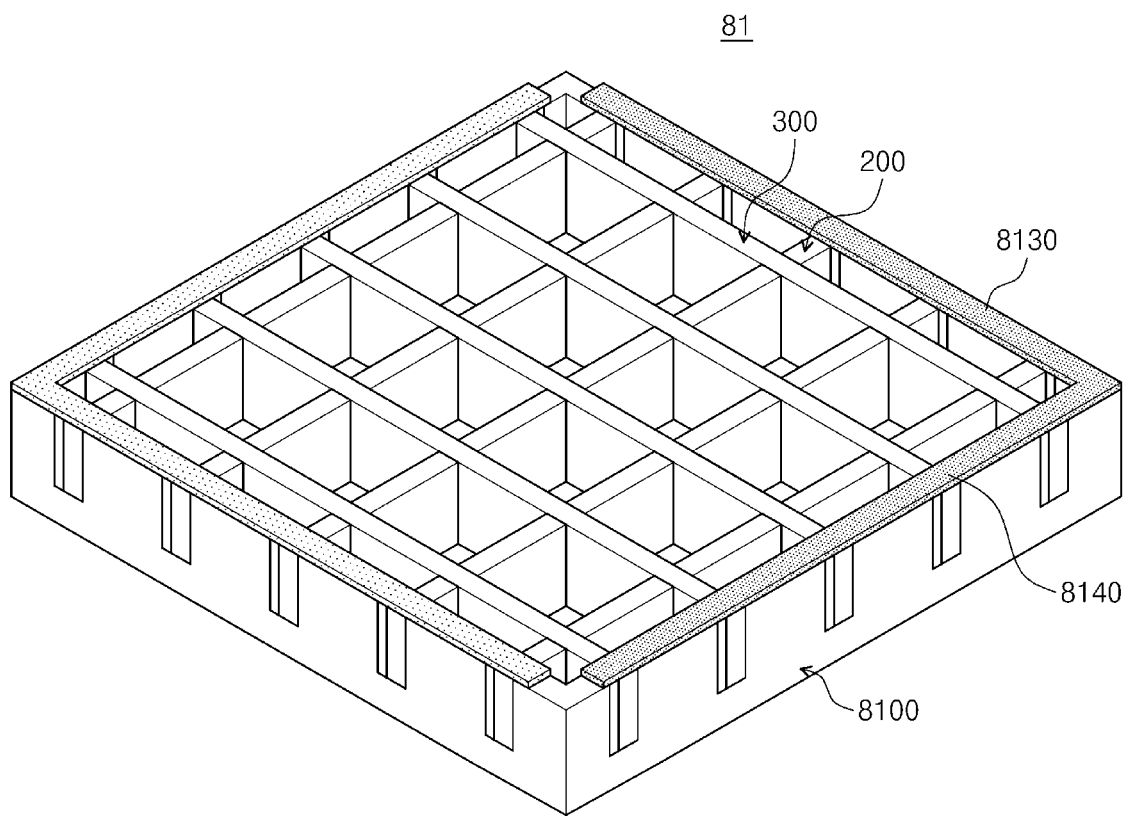
FIG. 19 is a perspective view illustrating a structure of a single photovoltaic module in the photovoltaic module according to the eighth embodiment of the present invention.

FIG. 18 is a perspective view illustrating a photovoltaic module according to an eighth embodiment of the present invention, and FIG. 19 is a perspective view illustrating a structure of a single photovoltaic module in the photovoltaic module according to the eighth embodiment of the present invention.

Hereinafter, only a configuration of the photovoltaic module 80 according to the eighth embodiment, which is different from the photovoltaic module 10 according to the first embodiment, will be described in detail.

Referring to FIGS. 18 and 19, the photovoltaic module 80 according to the eighth embodiment may be formed by electrically and physically connecting a plurality of single photovoltaic modules 81, 82, 83, and 84.

Here, like the photovoltaic module according to the above embodiments, the single photovoltaic module 81 may include a frame 8100, the first solar cell 200, and the second solar cell 300.

The first solar cell 200 and the second solar cell 300 may be alternately inserted into and arranged in the frame 8100. Meanwhile, a coupling structure of the first solar cell 200 and the second solar cell 300 may be the same as that according to the above embodiments, and thus a detailed description thereof will be omitted.

However, in the frame 8100, the plurality of first solar cells 200 and the plurality of second solar cells 300 are connected in parallel. Although not illustrated, the first solar cells 200 and the second solar cells 300 may be connected in series.

For example, the frame 8100 may include four side walls 8110, 8120, 8130, and 8140.

Here, the first side wall 8110 and the second side wall 8120 adjacent to each other may be electrically connected to the first polarities of the first solar cell 200 and the second solar cell 300 to have the first polarity, and the third side wall 8130 and the fourth side wall 8140 adjacent to each other may be electrically connected to the second polarities of the first solar cell 200 and the second solar cell 300 to have the second polarity.

Further, as illustrated in FIG. 18, when the plurality of single photovoltaic modules 81, 82, 83, and 84 are connected to each other, the first side wall having the first polarity in the first photovoltaic module 81 may be physically and electrically connected to the third side wall having the second polarity in the second photovoltaic module 82 disposed adjacent to the first photovoltaic module 81.

Further, the first side wall having the first polarity in the second photovoltaic module 82 may be physically and electrically connected to the third side wall having the second polarity in the third photovoltaic module 83 disposed adjacent to the second photovoltaic module 82.

Therefore, the plurality of photovoltaic modules 81, 82, 83, and 84 may have expanded areas to form the expanded photovoltaic module 80.

The above detailed description exemplifies the present invention. Furthermore, the above-mentioned contents describe the exemplary embodiment of the present invention, and the present invention may be used in various other combinations, changes, and environments. That is, the present invention may be modified and corrected without departing from the scope of the present invention that is disclosed in the specification, the equivalent scope to the written disclosures, and/or the technical or knowledge range of those skilled in the art. The written embodiment describes the best state for implementing the technical spirit of the present invention, and various changes required in the detailed application fields and purposes of the present invention may be made. Accordingly, the detailed description of the present invention is not intended to restrict the present invention in the disclosed embodiment state. Furthermore, it should be construed that the attached claims include other embodiments.

DESCRIPTION OF REFERENCE NUMERALS

10: Photovoltaic module
100: Frame
200, 300: Solar cell
The invention claimed is:
1. A photovoltaic module comprising:
a frame comprising at least three side walls;

a first solar cell comprising a first end and a second end connected to two side walls of the at least three side walls of the frame, respectively; and a second solar cell comprising a first end and a second end connected to two side walls of the at least three side walls of the frame and intersecting the first solar cell, wherein the first solar cell comprises a first insertion groove recessed from an upper side to a lower side and the second solar cell comprises a second insertion groove recessed from the lower side to the upper side, and wherein the first solar cell is inserted into the second insertion groove and the second solar cell is inserted into the first insertion groove such that the first solar cell and the second solar cell are coupled to each other.

2. The photovoltaic module of claim 1, wherein each of the at least three side walls comprises:

a body;

a plurality of protrusion portions spaced apart from each other in a lengthwise direction and protruding upward from the body; and a plurality of insertion grooves formed in an upper portion of the body by the plurality of protrusion portions, wherein each of the first solar cell and the second solar cell is inserted into the plurality of insertion grooves.

3. The photovoltaic module of claim 2, wherein each of the first solar cell and the second solar cell comprises a positive electrode and a negative electrode, and wherein the frame further comprises a conductor disposed on a side surface of at least one of the plurality of protrusion portions to be electrically connected to the positive electrode or the negative electrode.

4. The photovoltaic module of claim 3, wherein the conductor is disposed to cover a side surface and an upper surface of each of the plurality of protrusion portions in the lengthwise direction, and wherein the conductor is disconnected in the plurality of insertion grooves.

5. The photovoltaic module of claim 3, wherein the conductor comprises:

a first conductor disposed on a side surface of each of the plurality of protrusion portions; and a second conductor disposed in the body and configured to connect the first conductor of each of the plurality of protrusion portions.

6. The photovoltaic module of claim 2, wherein the first and second ends of the first solar cell and the first and second ends of the second solar cell are inserted into the plurality of insertion grooves of the side wall.

7. The photovoltaic module of claim 1, wherein the first insertion groove is inclined with respect to the upper side.

8. The photovoltaic module of claim 1, further comprising:

a filling material filled inside the frame.

9. The photovoltaic module of claim 8, wherein the filling material comprises dispersed light scattering particles or fluorescent dyes.

10. The photovoltaic module of claim 1, a total reflection layer or a diffuse reflection layer is disposed on at least one side surface of the first solar cell and the second solar cell.

11. The photovoltaic module of claim 4, wherein the conductor comprises:

an upper end, which covers the upper surface of each of the plurality of protrusion portions; and a side conductor extending from the upper end of the conductor and disposed on the side surface of each of the plurality of protrusion portions, and wherein the side conductor is spaced apart from the side surface of each of the plurality of protrusion portions as a distance from the upper end of the conductor increases.

12. The photovoltaic module of claim 11, further comprising:

an elastic body disposed between the side conductor and the side surface of each of the plurality of protrusion portions.

13. The photovoltaic module of claim 5, wherein the first conductor is spaced apart from the side surface of each of the plurality of protrusion portions as a distance from an upper end of the conductor increases.

14. The photovoltaic module of claim 13, further comprising:

an elastic body disposed between the first conductor and the side surface of each of the plurality of protrusion portions.

15. The photovoltaic module of claim 3, wherein the conductor is disposed to cover at least one surface selected from the group consisting of an upper surface of the body in each of the plurality of insertion grooves, and one side surface of each of the plurality of protrusion portions in the lengthwise direction.

16. The photovoltaic module of claim 5, wherein the first conductor is disposed on one area among a lower area and an upper area of the side surface of each of the plurality of protrusion portions.

17. A photovoltaic module, wherein a first photovoltaic module and a second photovoltaic module are physically and electrically connected to each other, each of the first photovoltaic module and the second photovoltaic module comprises:

a frame comprising at least three side walls;

a first solar cell comprising a first end and a second end connected to two side walls of the at least three side walls of the frame, respectively; and a second solar cell comprising a first end and a second end connected to two side walls of the at least three side walls of the frame and intersecting the first solar cell, wherein the first solar cell comprises a first insertion groove recessed from an upper side to a lower side and the second solar cell comprises a second insertion groove recessed from the lower side to the upper side, and wherein the first solar cell is inserted into the second insertion groove and the second solar cell is inserted into the first insertion groove such that the first solar cell and the second solar cell are coupled to each other.

18. The photovoltaic module of claim 17, wherein a plurality of the first solar cells and a plurality of the second solar cells are connected in series to or in parallel to the frame.

19. The photovoltaic module of claim 17, wherein one side wall of the at least three side walls has a first polarity and another side wall of the at least three side walls has a second polarity.

20. The photovoltaic module of claim 19, wherein the side wall having the first polarity in the first photovoltaic module is coupled to the side wall having the second polarity in the second photovoltaic module.

* * * * *